(12) United States Patent
Watanabe

(10) Patent No.: US 6,304,726 B1
(45) Date of Patent: Oct. 16, 2001

(54) CAMERA

(75) Inventor: Yoji Watanabe, Fuchu (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/514,735

(22) Filed: Feb. 28, 2000

(30) Foreign Application Priority Data

Mar. 2, 1999 (JP) .................................................. 11-053750

(51) Int. Cl.$^7$ .................................................. G03B 17/00
(52) U.S. Cl. .............................................. 396/53; 396/542
(58) Field of Search ................................ 396/52, 53, 54, 396/55, 542

(56) References Cited

U.S. PATENT DOCUMENTS 5,523,892 * 6/1996 Yoshibe et al. .................... 396/52 X
5,666,563 * 9/1997 Iijma et al. ............................. 396/53
6,104,878 * 8/2000 Toguchi et al. ........................ 396/52

FOREIGN PATENT DOCUMENTS 7-83750   3/1995 (JP) .
9-134216  5/1997 (JP) .

* cited by examiner

Primary Examiner—W. B. Perkey
(74) Attorney, Agent, or Firm—Frishauf, Holtz, Goodman, Langer & Chick, P.C.

(57) ABSTRACT

Disclosed is a camera capable of detecting shocks without enlarging the camera or increasing the cost. A flexible board is secured to a camera body by a plurality of screws. A shock sensor for detecting shocks applied to the camera is mounted on a sensor mounting section extending from a part of the flexible board. The sensor mounting section with the shock sensor mounted thereon is secured to the camera body by a plurality of screws in the close vicinity of the shock sensor.

13 Claims, 3 Drawing Sheets

CAMERA

CROSS-REFERENCE TO RELATED APPLICATION

This application is based upon and claims the benefit of priority from the prior Japanese Patent Application No. 11-053750, filed Mar. 2, 1999, the entire contents of which are incorporated herein by reference.

BACKGROUND OF THE INVENTION

The present invention relates to a camera capable of detecting shocks which are caused when fallen or the like and which may damage the camera.

Various kinds of cameras have been proposed which detect hand-originated blurring and shocks. For example, Jpn. Pat. Appln. KOKAI Publication No. 9-134216 discloses a camera which can detect shocks applied to the camera.

This publication however has no detailed description of how to mount a shock sensor to the camera body. As the shock sensor is one type of an acceleration sensor, it is a blurring sensor if one does not consider the difference in frequency response characteristic between those two sensors.

A typical way of mounting a blurring sensor is to secure the detecting section (sensor) to the support member and then mounting the support member to the camera body as described in, for example, Jpn. Pat. Appln. KOKAI Publication No. 7-83750.

As the support member has such a shape as to enclose the sensor portion, it is considerably larger than the sensor. This inevitably makes the mount area of the camera body larger, thus resulting in a larger camera. The provision of the support member eventually increases the cost of the camera.

BRIEF SUMMARY OF THE INVENTION

Accordingly, it is an object of the present invention to provide a camera capable of detecting shocks without enlarging the camera or increasing the cost.

To achieve the above object, according to the first aspect of this invention, there is provided a camera comprising a camera body; a flexible substrate having electric parts mounted thereon; a vibration detecting element, mounted on the flexible substrate, for detecting vibration applied to the camera body; and a fixing member for securing the flexible substrate to the camera body in a vicinity of the vibration detecting element.

According to the second aspect of this invention, there is provided a camera comprising a camera body; a flexible substrate secured to the camera body; and a shock detecting element, mounted on the camera body, for detecting shocks applied to the camera, wherein the flexible substrate on which the shock detecting element is mounted is secured to the camera body by screws in a vicinity of the shock detecting element.

According to the third aspect of this invention, there is provided a camera comprising a camera body; a shock detecting element for detecting shocks applied to the camera; and an electric circuit board having the shock detecting element mounted thereon, wherein the shock detecting element is integrally secured to the camera body by attaching the electric circuit board to the camera body by screws.

According to the fourth aspect of this invention, there is provided a camera comprising a camera body; a shock detecting element for detecting shocks applied to the camera; a flexible board having the shock detecting element mounted thereon; an electric circuit board having other electric parts than the shock detecting element mounted thereon; a pressing member for pressing a first connector section of the flexible board and a second connector section of the electric circuit board; and screws for integrally securing the pressing member, the first connector section and the second connector section to the camera body as the screws penetrate the pressing member, the first connector section and the second connector section.

According to the fifth aspect of this invention, there is provided a camera comprising a camera body; a shock detecting element for detecting shocks applied to the camera; a flexible board having the shock detecting element mounted thereon; and screws for securing the flexible board to the camera body in a vicinity of the shock detecting element, wherein the shock detecting element is mounted at an extending portion which is a part of the flexible board.

According to the sixth aspect of this invention, there is provided a camera comprising a camera body; a shock detecting element for detecting shocks applied to the camera; a flexible board having a first mount surface on which a control circuit for controlling the shock detecting element is mounted, and a second mount surface on which the shock detecting element is mounted; a connecting section for electrically connecting the first mount surface to the second mount surface; and screws for securing the flexible board to the camera body in a vicinity of the shock detecting element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will now be described with reference to the accompanying drawings.

Figure 1:
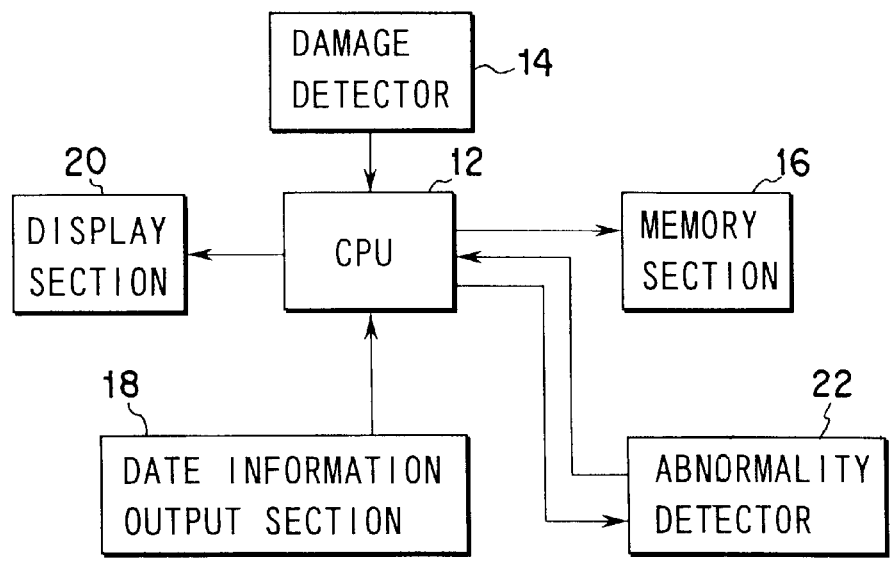
FIG. 1 is a block diagram illustrating the structure of a shock detection device to be adapted to a camera according to a first embodiment of this invention.

FIG. 1 presents a block diagram illustrating the structure of a shock detection device to be adapted to a camera according to a first embodiment of this invention.

In FIG. 1, the essential portions of this shock detection device include a CPU 12, a damage detector 14, a memory section 16, a date information output section 18, a display section 20 and an abnormality detector 22.

The damage detector 14 detects a predetermined damage which is externally made on an apparatus equipped with this shock detection device, and outputs damage detection information.

The memory section 16 is capable of storing information about the date on which application of the damage has been detected, the portion which has been damaged, the level of the damage and so forth.

The date information output section 18 outputs the information of the date on which the application of the damage has been detected. The display section 20 displays the stored contents of the memory section 16.

The abnormality detector 22 inspects an abnormality on each component of the apparatus equipped with this shock detection device based on the detection information from the damage detector 14.

The CPU 12, which is constructed by operation control means, receives information from the damage detector 14, performs a sequence control, causes the memory section 16 to store the detection information and causes the display section 20 to display information.

Suppose a predetermined damage is externally applied to the apparatus equipped with the shock detection device having the above-described structure. When the damage detector 14 detects the application of this damage, the damage detector 14 sends damage detection information to the CPU 12. At this time, information of the date on which the application of the damage has been detected is supplied to the CPU 12 from the date information output section 18.

The portion where the damage has been made, the magnitude of the damage, etc. are stored in the memory section 16 via the CPU 12. The stored contents of the memory section 16 are displayed on the display section 20. The abnormality detector 22 checks an abnormality on each component of the apparatus equipped with this shock detection device based on the detection information from the damage detector 14.

Figure 2:
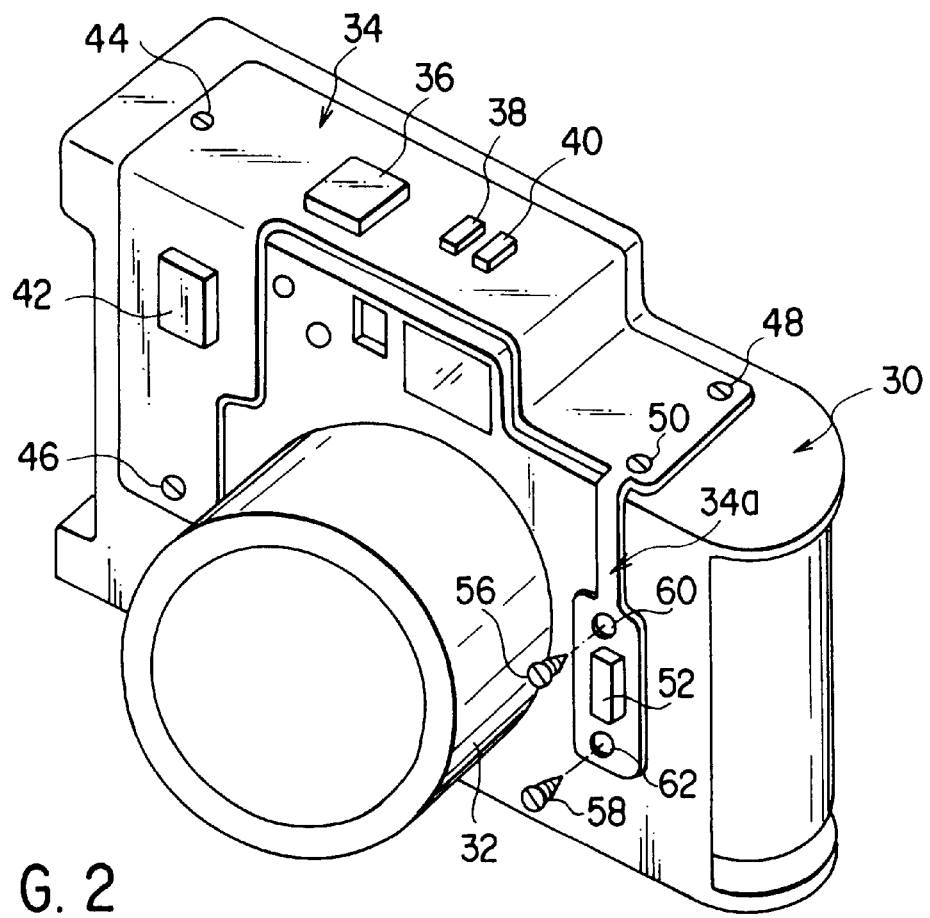
FIG. 2 is a perspective view showing a camera equipped with the shock detection device according to the first embodiment of this invention, with the outer frame portion of the camera removed.

FIG. 2 is a perspective view showing a camera equipped with the shock detection device according to the first embodiment of this invention, with the outer frame portion of the camera removed.

Referring to FIG. 2, a camera body 30 has a lens body 32 attached to its front surface at nearly the center. A flexible board 34 is arranged along the outer surface of the camera body 30. For example, electric circuit parts 36, 38, 40 and 42 are mounted on the flexible board 34 by soldering. The flexible board 34 is secured to the camera body 30 by screws 44, 46, 48, 50 and the like.

Extending from a part of the flexible board 34 is a sensor mounting section 34a for mounting a shock sensor 52 which is an electric part serving as the damage detector 14. This sensor mounting section 34a is bent frontward from the top surface portion of the camera body 30 and is secured to the camera body 30 by screws 56 and 58 respectively fitted in screw holes 60 and 62.

Care should be taken to fix the shock sensor 52 for detecting shocks to the camera body 30. If the shock sensor 52 is insufficiently secured to the camera body 30 (i.e., if the shock sensor 52 rattles), shocks applied to the camera body 30 may not be transmitted to the shock sensor 52 sufficiently or vibration at the time of zooming or depressing the shutter may be transmitted to the sensor mounting section 34a or the flexible board and applied to the shock sensor 52. As a result, the shock sensor 52 may output an erroneous signal.

According to this embodiment, therefore, the shock sensor 52 is securely soldered to the sensor mounting section 34a or the flexible board in order to prevent such an erroneous operation. In addition, the screw holes 60 and 62 to be used in securing the camera body 30 are provided in the vicinity of the mounting position of the shock sensor 52, and the sensor mounting section 34a is secured to the camera body 30 by the two screws 56 and 58 fitted in those holes.

As the shock sensor 52 is fixed to the camera body 30 by the screws in the close vicinity of the shock sensor 52, the shock sensor 52 will not rattle or it is possible to avoid such a shortcoming that shocks applied to the camera body 30 are not sufficiently transmitted to the shock sensor 52.

Figure 3:
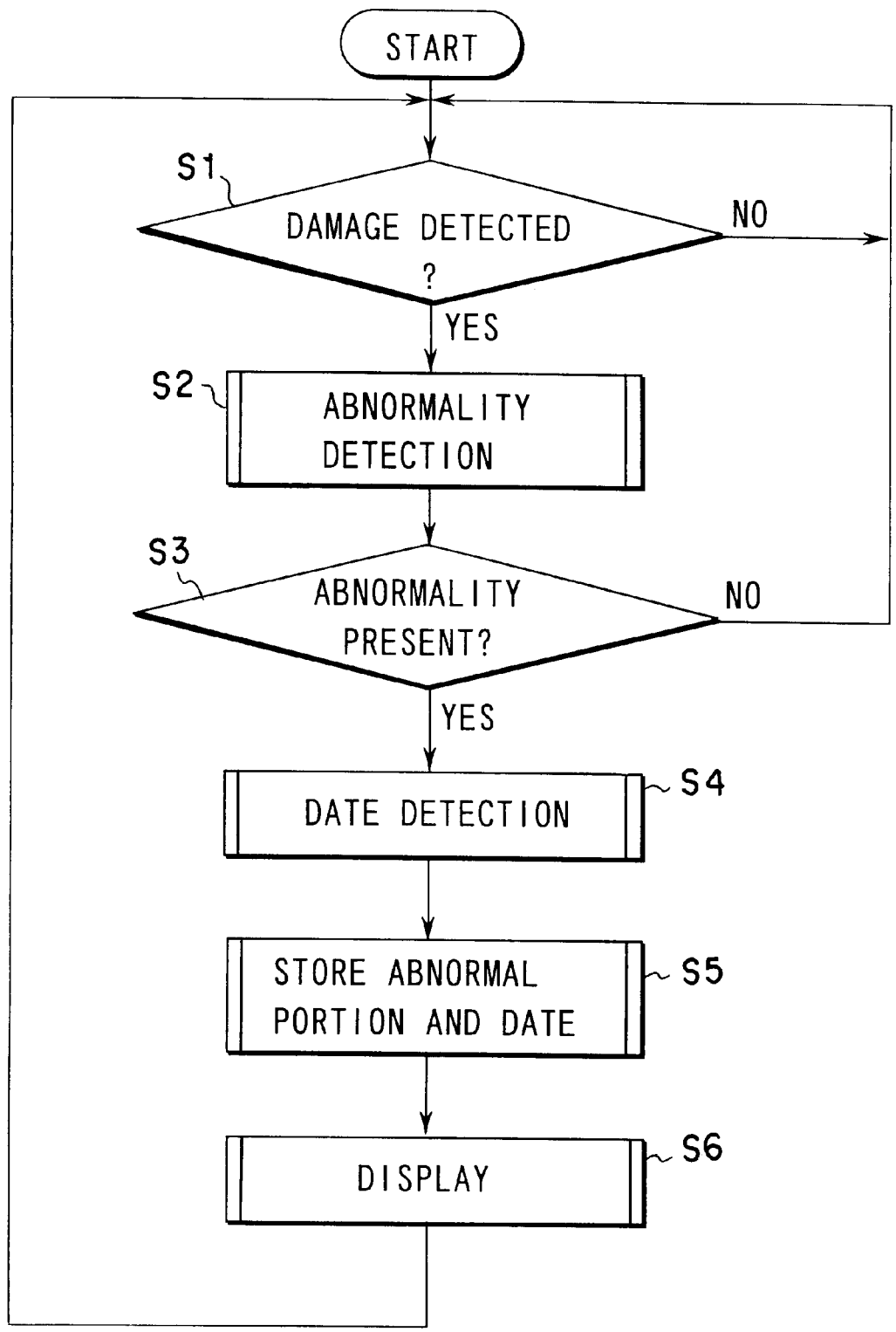
FIG. 3 is a flowchart for explaining the operation of detecting shocks on the camera.

The operation of shock detection of the thus constituted camera will now be described with reference to the flowchart in FIG. 3.

In step S1, the damage detector 14 (shock sensor 52) detects if predetermined external force (damage) has been applied to the camera body 30 equipped with this shock detection device. When a damage is detected, the damage detector 14 sends damage detection information to the CPU 12. Probable damages are shocks applied to the camera or a change in the environment of the camera.

In step S2, when the CPU 12 receives the damage detection information from the damage detector 14, the CPU 12 executes an abnormality detection subroutine. That is, the CPU 12 controls the abnormality detector 22 to initiate inspection of any abnormality on each component of the camera. In step S3, it is determined if an abnormality is present.

When no abnormality is detected in step S3, the CPU 12 considers that there is no influence caused by the damage, and returns to the step S1 to resume damage detection. When an abnormality is detected in step S3, on the other hand, the flow proceeds to step S4 where the CPU 12 receives date information from the date information output section 18. In step S5, information from the abnormality detector 22 on the portion where the abnormality has occurred and the date information from the date information output section 18 are stored in the memory section 16. In addition, corresponding information is displayed on the display section 20 in step S6.

The date information is not limited to the date, but includes all necessary time information such as the year, month, day, hour and seconds. The user can therefore check what is on the display section 20 and take the necessary action accordingly.

According to the first embodiment, as the shock sensor 52 is fixed to the camera body 30 by the screws in the close vicinity of the shock sensor 52, shocks applied to the camera can be detected accurately.

The flexible board to be installed in a camera often has a plurality of boards connected by connectors or the like. As a typical way of making such installment, the flexible board may be connected to a sub flexible board by pressing those two boards by clamping a metal fitting or the like from above, with the connector portions of those two boards in contact to each other. The following discusses a camera which has such two boards connected in this manner as a second embodiment of this invention.

Figure 4:
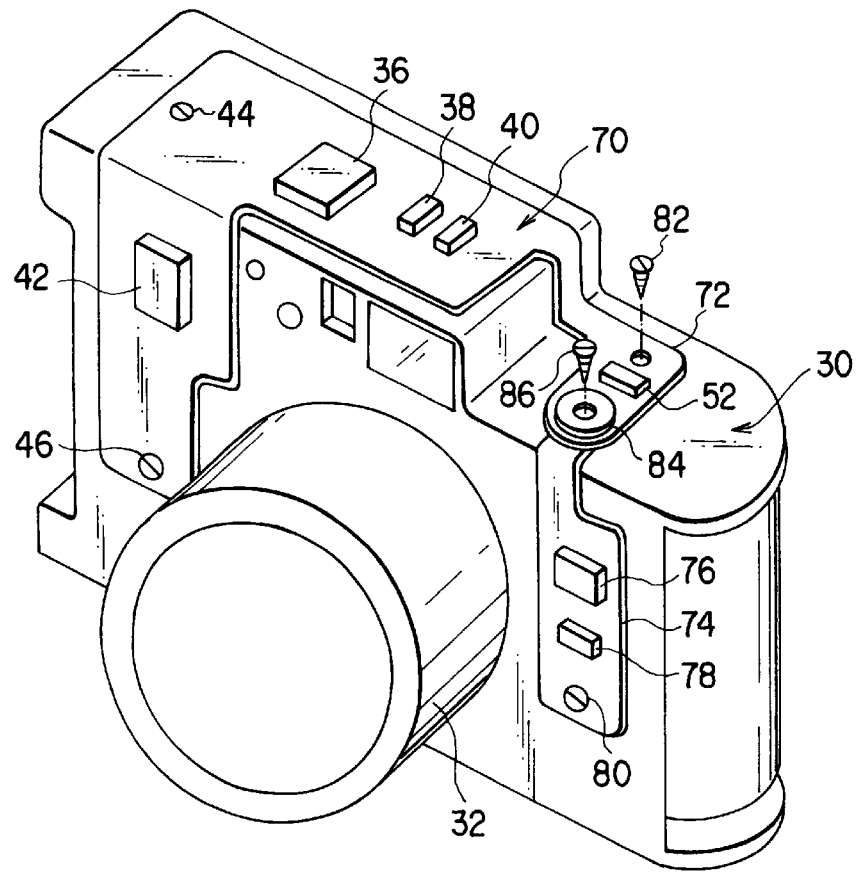
FIG. 4 is a perspective view showing a camera equipped with a shock detection device according to a second embodiment of this invention, with the outer frame portion of the camera removed.

FIG. 4 is a perspective view showing a camera equipped with a shock detection device according to a second embodiment of this invention, with the outer frame portion of the camera removed.

In the following description, like or same reference numerals are given to those components of the second embodiment which are the same as the corresponding components of the first embodiment to avoid the redundant description.

Referring to FIG. 4, a main flexible board 70 is arranged along the outer surface of the camera body 30. For example, electric circuit parts 36, 38, 40 and 42 are mounted on the main flexible board 70 by soldering. The shock sensor 52 which is an electric part is soldered to a sensor mounting section 72 which extends from the main flexible board 70.

A sub flexible board 74 is so arranged as to be bent frontward from the top surface portion of the camera body 30. Electric circuit parts 76 and 78, for example, are mounted on the sub flexible board 74 by soldering. This sub flexible board 74 is secured to the camera body 30 by a screw 80.

On the sub flexible board 74, the sensor mounting section 72 is secured to the camera body 30 by a screw 82 in the close vicinity of the shock sensor 52. Further, the sensor mounting section 72 is connected to the sub flexible board 74. This connection is accomplished by pressing the sensor mounting section 72 and the sub flexible board 74 from above using a metal fitting 84 with the connector portions (not shown) of both the section 72 and the board 74 in contact with each other. Under this situation, the sensor mounting section 72 and the sub flexible board 74 are connected together and secured to the camera body 30 via the metal fitting 84 by a screw 86.

Because the mount area of the camera is very narrow, two screw holes cannot be formed near the shock sensor in some case. In such a case, one of the screw holes has only to be used as a screw hole for the metal fitting.

A third embodiment of this invention will now be discussed.

Figure 5:
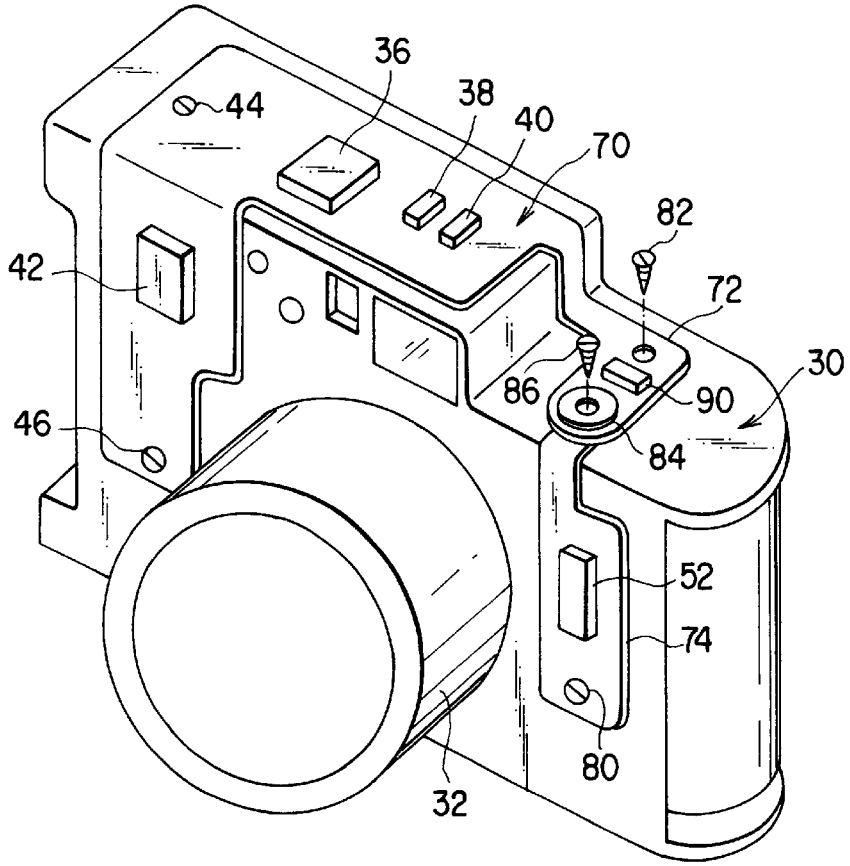
FIG. 5 is a perspective view showing a camera equipped with a shock detection device according to a third embodiment of this invention, with the outer frame portion of the camera removed.

FIG. 5 is a perspective view showing a camera equipped with the shock detection device according to a third embodiment of this invention, with the outer frame portion of the camera removed.

In the following description, like or same reference numerals are given to those components of the third embodiment which are the same as the corresponding components of the first and second embodiments to avoid the redundant description.

Referring to FIG. 5, the shock sensor 52 which is an electric part is soldered to the sub flexible board 74. The sub flexible board 74 is secured to the camera body 30 by the screw 80. An electric circuit part 90 is soldered to the sensor mounting section 72 that extends from the main flexible board 70.

Even the arrangement of the shock sensor 52 and the electric circuit part 90 in the opposite way to the one used in the second embodiment can provide the same advantages as obtained by the second embodiment.

Although the foregoing description of the second and third embodiments describes the main flexible board, the sub flexible board and the sensor mounting section being secured to the camera body by screws, the fixing is not limited to this particular manner. Alternatively, the individual flexible boards and the sensor mounting section may be secured to the camera body by an adhesive, such as a double-sided adhesive tape, instead of using screws.

Although the components are mounted on the flexible board in the above-described embodiments, the same advantages can still be provided by using a hard board instead.

As apparent from the above, this invention can provide a camera capable of detecting shocks without enlarging the camera or increasing the cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A camera comprising:
   a camera body;
   a flexible board having electric parts mounted thereon;
   a vibration detecting element, mounted on said flexible board, for detecting vibration applied to said camera body; and
   a fixing member for securing said flexible board to said camera body in a vicinity of said vibration detecting element.

2. The camera according to claim 1, wherein said fixing member is screws.

3. The camera according to claim 1, wherein said fixing member is a double-sided adhesive tape.

4. The camera according to claim 1, further comprising an electric circuit board, and
   wherein said fixing member secures both said flexible board and said electric circuit board to said camera body.

5. The camera according to claim 1, wherein said vibration detecting element detects shocks applied to said camera body.

6. The camera according to claim 1, wherein said vibration detecting element is securely soldered onto said flexible board.

7. The camera according to claim 1, wherein said camera body has a lens barrel; and
   said vibration detecting element is secured to said flexible board in a vicinity of said lens barrel.

8. A camera comprising:
   a camera body;
   a flexible board secured to said camera body; and
   a shock detecting element, mounted on said camera body, for detecting shocks applied to said camera,
   wherein said flexible board on which said shock detecting element is mounted is secured to said camera body by screws in a vicinity of said shock detecting element.

9. A camera comprising:
   a camera body;
   a shock detecting element for detecting shocks applied to said camera; and
   an electric circuit board having said shock detecting element mounted thereon,
   wherein said shock detecting element is integrally secured to said camera body by attaching said electric circuit board to said camera body by screws.

10. A camera comprising:
    a camera body;
    a shock detecting element for detecting shocks applied to said camera;
    a flexible board having said shock detecting element mounted thereon;
    an electric circuit board having other electric parts than said shock detecting element mounted thereon;

a pressing member for pressing a first connector section of said flexible board and a second connector section of said electric circuit board; and screws for integrally securing said pressing member, said first connector section and said second connector section to said camera body as said screws penetrate said pressing member, said first connector section and said second connector section.

11. A camera comprising:

a camera body;

a shock detecting element for detecting shocks applied to said camera;

a flexible board having said shock detecting element mounted thereon; and screws for securing said flexible board to said camera body in a vicinity of said shock detecting element, wherein said shock detecting element is mounted at an extending portion which is a part of said flexible board.

12. A camera comprising:

a camera body;

a shock detecting element for detecting shocks applied to said camera;

a flexible board having a first mount surface on which a control circuit for controlling said shock detecting element is mounted, and a second mount surface on which said shock detecting element is mounted;

a connecting section for electrically connecting said first mount surface to said second mount surface; and screws for securing said flexible board to said camera body in a vicinity of said shock detecting element.

13. The camera according to claim 12, wherein said first mount surface is fixed to a top surface of said camera body and said second mount surface is fixed to a front surface of said camera body.

* * * * *